United States Patent [19]

Wilcox

[11] 4,327,333
[45] Apr. 27, 1982

[54] AGC CURRENT SOURCE

[75] Inventor: Milton E. Wilcox, San Jose, Calif.

[73] Assignee: National Semiconductor Corporation, Santa Clara, Calif.

[21] Appl. No.: 130,803

[22] Filed: Mar. 17, 1980

[51] Int. Cl.³ .............................................. H03G 3/10
[52] U.S. Cl. .................................... 330/278; 330/254; 330/279
[58] Field of Search ............... 330/254, 279, 280, 278; 307/264, 296

[56] References Cited

U.S. PATENT DOCUMENTS

| | | | |
|---|---|---|---|
| 3,488,604 | 1/1970 | Smilowitz | 330/279 |
| 3,962,650 | 6/1976 | Gay | 300/254 |
| 4,065,725 | 12/1977 | Lillis | 330/254 |

*Primary Examiner*—Michael J. Tokar

*Attorney, Agent, or Firm*—Gail W. Woodward; James A. Sheridan; Neil B. Schulte

[57] ABSTRACT

A circuit for supplying a pair of currents that vary in opposite directions as a function of a control current. The pair of currents are coupled to an amplifying stage in which the gain varies in accordance with the relative magnitude of the currents. The circuit includes a differential current source having two output current terminals and a pair of controlled inputs. Both inputs are coupled to individual current sources. One input includes a resistor-diode current sink and the other input includes a current mirror sink. The control current is coupled to the current mirror thus varying the load on the related differential inputs. The current mirror input is also coupled to the diode current sink in the one differential input so that a delay can be introduced into the response to control current. That is, the control current must exceed a predetermined value before the gain reduction action occurs.

8 Claims, 1 Drawing Figure

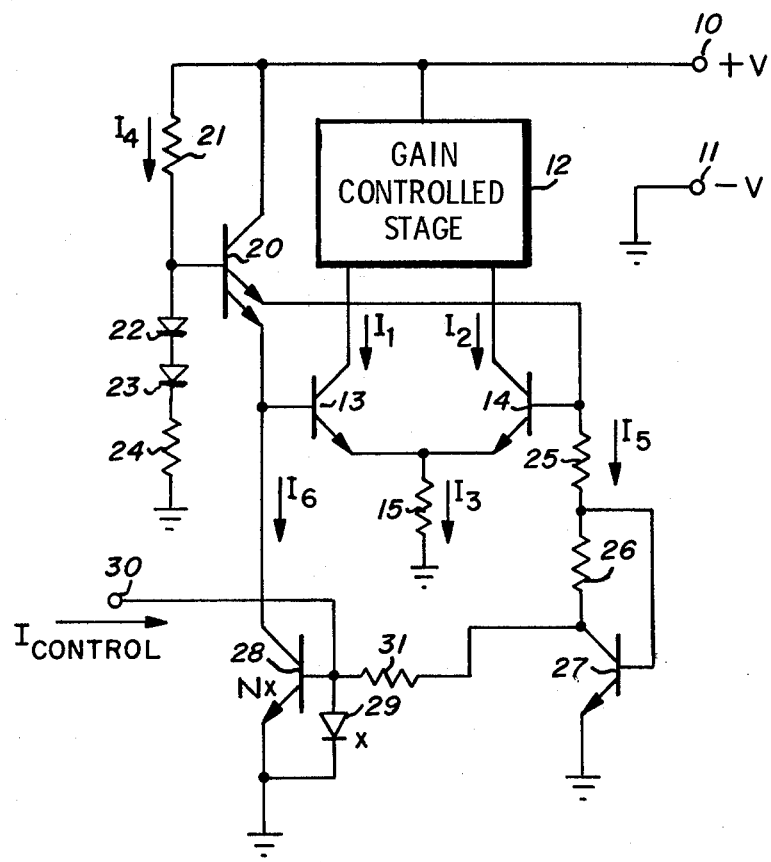

AGC CURRENT SOURCE

BACKGROUND OF THE INVENTION

The invention relates to improved means for controlling a pair of currents that in turn control the gain of a signal amplifier. The currents vary in opposite directions in response to an AGC current. Additionally, where plural stages are involved, a delay action is desired.

SUMMARY OF THE INVENTION

It is an object of the invention to provide a pair of oppositely varying currents for gain control action in a signal amplifier.

It is a further object of the invention to provide a pair of oppositely varying currents in response to a control current wherein the control current must exceed a threshold before any change in the varying currents occurs.

These and other objects are achieved in the following circuit configuration. A pair of transistors are connected differentially to sink the varying currents of their collector electrodes. The bases are coupled to current sources. The first base is coupled to a resistor-transistor current sink. The second base is coupled to a current mirror current sink, the input of which is coupled to the control current. The input is also resistor coupled to the transistor in the first base whereby a delay function can be introduced. When the control current exceeds a threshold value, determined by the delay, the output currents will be oppositely varied as a function of the control current.

BRIEF DESCRIPTION OF THE DRAWING

The single FIGURE of the drawing is a schematic diagram of the circuit of the invention.

DESCRIPTION OF THE INVENTION

In the drawing the circuit is operated from a supply potential connected between terminals 10 and 11. The amplifying stage 12 to be controlled is disclosed in copending application No. 121,946 filed by Elias S. Papanicolaou on Feb. 15, 1980 titled GAIN CONTROLLED AMPLIFIER CIRCUIT.

Stage 12 requires two currents $I_1$ and $I_2$ varying differentially to control stage gain. Differential connected transistors 13 and 14 provide these currents and resistor 15 determines the tail current ($I_3$). In this kind of ciruit $I_3$ substantially equals $I_1$ plus $I_2$.

Dual emitter transistor 20 provides a pair of voltages for the differential transistors 13 and 14. Resistor 21 provides a current $I_4$ that flows substantially in diodes 22 and 23 and resistor 24. With the diode and transistor configuration, it can be seen that the voltage across resistor 15 is almost equal to the voltage across resistor 24.

Current $I_5$ flows substantially in resistors 25 and 26 and transistor 27. The base of transistor 27 operates at $V_{BE}$ above ground and any current flowing in resistor 26 will force the collector below the base. Thus, as long as transistor 27 is not saturated, its collector voltage will remain at a substantially constant level.

Transistor 28 and diode 29 form a current mirror that sinks $I_6$ from the base of transistor 13. As current $I_{CONTROL}$ is applied to terminal 30, the current mirror will vary $I_6$. An increasing control current will pull the base of transistor 13 low and reduce $I_1$. Since transistors 13 and 14 are differentially connected, $I_2$ will increase a like amount. With no control current, $I_6$ will be zero and transistor 20 will pull the base of transistor 13 high and turn it on. This will increase $I_1$ to maximum and turn $I_2$ off.

Resistor 31 couples the current mirror input to the constant voltage collector of transistor 27. Since this collector is below one $V_{BE}$ by the drop across resistor 26, diode 29 and transistor 28 will be off. In fact, until $I_{CONTROL}$ at terminal 30 rises to a value that will develop enough voltage across resistor 31 to turn diode 29 on, $I_6$ will remain at zero. Thus, a turn on delay is present and is predetermined by the values of resistor 26 and $I_5$. Once the potential at the base of transistor 28 exceeds the turn on level, the voltage is clamped by the diode and transistor conduction.

It will be noted that transistor 28 is shown having an area which is N times the area of diode 29. This means that the current mirror is also a current amplifier with a gain N once it is turned on. This gain enhances the control action for the circuit.

EXAMPLE

The circuit of the drawing was constructed using typical IC NPN transistors. The diodes were actually NPN transistors with their collectors connected to their bases. The following component values were used.

| Component | Value |
| --- | --- |
| Resistor 15 | 330 ohms |
| Resistor 21 | 4.1 K ohms |
| Resistor 24 | 500 ohms |
| Resistor 25 | 2.5 K ohms |
| Resistor 26 | 1 K ohms |
| Resistor 31 | 1 K ohms |
| 28/29 Area ration | 4 |

The circuit was operated from a 6 volt supply. The combined value of $I_1$ and $I_2$ was about 2 ma. With zero current into terminal 30, substantially all of this current flowed in transistor 13. The control threshold was about 0.2 ma. With the control current at 0.5 ma, substantially the entire 2 ma flowed in transistor 14 as $I_2$.

With resistor 26 shorted out (zero ohms), the threshold was eliminated and the control action started at very low control current values.

The invention has been described and an operating example given. Clearly there are equivalents and alternatives within the spirit and intent of the invention. Accordingly, it is intended that the scope of the invention be limited only by the following claims.

I claim:

1. A circuit for automatic gain control wherein a pair of output currents are varied in opposite directions in response to a control current, said circuit comprising:
   differential control stage means having tail current supply means, first and second inputs and providing first and second output currents;
   voltage supply means coupled to said first and second inputs;
   first current sink means coupled to said first input, said first current sink means including the series combination of a resistor and a conducting transistor;
   a current mirror having an output coupled to said second input and an input coupled to a source of control current; said current mirror input being resistor coupled to said conducting transistor, whereby said current mirror acts as a second current sink for said second input variable as a function of said control current.

2. The circuit of claim 1 wherein said current mirror has current gain.

3. The circuit of claim 1 wherein said conducting transistor has a resistor coupled in series with its collector and its base is returned to a potential that is higher than the collector potential and the current mirror is coupled to the collector of said conducting transistor, whereby a delayed response to said control current is present.

4. A current steering circuit for controlling a gain controlled amplifier in response to a control current, said circuit comprising:

first and second power supply rails connectible to a source of operating power;

first and second transistors having their emitters coupled together and through current supply means to said second power supply rail, collectors coupled to said controlled amplifier, and terminals; base first and second voltage sources coupled between said first power supply rail and respectively to said first and second transistor bases;

third transistor means having its emitter coupled to said second power supply rail, its collector coupled via first resistor means to said second transistor base, and a base coupled to an intermediate point on said first resistor means; and a current mirror sink having an input coupled to a source of said control current and an output coupled to said first transistor base.

5. The circuit of claim 4 further comprising:

second resistor means coupling said current mirror input to said third transistor means collector whereby a delayed response to said control current is present with the delay value being a function of the location of said intermediate point on said first resistor means.

6. The circuit of claim 5 wherein said current mirror is constructed to have current gain.

7. The circuit of claim 6 wherein said first and second voltage sources are obtained from the emitters of a dual emitter transistor having its collector coupled to said first power supply terminal and having a base coupled to a voltage divider connected across said power supply rails.

8. The circuit of claim 7 wherein said voltage divider includes at least a pair of forward biased diodes and a resistor coupled between said plural emitter transistor base and said second power supply rail.

* * * * *